United States Patent
Kim et al.

(10) Patent No.: US 8,961,851 B2
(45) Date of Patent: Feb. 24, 2015

(54) APPARATUS AND METHOD OF FABRICATING FLAT PLATE DISPLAY

(75) Inventors: Ju-Hyuk Kim, Goyang-si (KR); Tae-Joon Song, Paju-si (KR); Seong-Pil Cho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 27 days.

(21) Appl. No.: 12/913,649

(22) Filed: Oct. 27, 2010

(65) Prior Publication Data

US 2011/0147990 A1    Jun. 23, 2011

(30) Foreign Application Priority Data

Dec. 23, 2009    (KR) .......................... 10-2009-0129799

(51) Int. Cl.
  *B29C 59/00*    (2006.01)
  *G09F 9/30*    (2006.01)
  *G03F 7/00*    (2006.01)

(52) U.S. Cl.
  CPC .............. *G09F 9/30* (2013.01); *G03F 7/0002* (2013.01)
  USPC ........... 264/293; 264/319; 264/299; 264/496; 425/385

(58) Field of Classification Search
  CPC ..................... G03F 7/0002; B29C 2059/023
  USPC ................. 264/319, 293, 299, 496; 425/385; 977/887
  See application file for complete search history.

(56) References Cited

U.S. PATENT DOCUMENTS

| | | | | |
|---|---|---|---|---|
| 5,830,548 | A | * | 11/1998 | Andersen et al. ............ 428/36.4 |
| 6,875,318 | B1 | * | 4/2005 | Gabriele et al. ............ 204/192.1 |
| 7,521,272 | B2 | | 4/2009 | Kiyomiya et al. |
| 2002/0112984 | A1 | * | 8/2002 | Moran et al. .................. 206/569 |
| 2004/0183236 | A1 | * | 9/2004 | Ogino et al. .................. 264/496 |
| 2005/0255618 | A1 | * | 11/2005 | Kiyomiya et al. ............. 438/26 |
| 2012/0100369 | A1 | * | 4/2012 | Hanazawa et al. ............ 428/352 |
| 2014/0004312 | A1 | * | 1/2014 | Foreman et al. .............. 428/172 |

FOREIGN PATENT DOCUMENTS

| | | | | |
|---|---|---|---|---|
| JP | WO2010001538 | * | 1/2010 | ............ B29C 33/40 |
| KR | 10-2004-0083002 | | 9/2004 | |
| TW | 200949320 A1 | | 12/2009 | |
| TW | 200949783 A1 | | 12/2009 | |

* cited by examiner

*Primary Examiner* — Yogendra Gupta
*Assistant Examiner* — Ninh Van Le
(74) *Attorney, Agent, or Firm* — McKenna Long & Aldridge LLP

(57) ABSTRACT

A fabricating apparatus and a method of a flat plate display are disclosed. A fabricating apparatus of a flat plate display includes a stage on which a substrate having liquid resin formed thereon is seated, a imprinting mold bonded with the liquid resin of the substrate to form a thin film pattern on the substrate, the imprinting mold comprises projections and grooves, and a planarization layer formed between the stage and the substrate to planarize a surface of the stage.

2 Claims, 8 Drawing Sheets

APPARATUS AND METHOD OF FABRICATING FLAT PLATE DISPLAY

CROSS REFERENCE TO RELATED APPLICATION

This application claims the benefit of the Patent Korean Application No. 10-2009-0129799, filed on Dec. 23, 2009, which is hereby incorporated by reference as if fully set forth herein.

BACKGROUND OF THE DISCLOSURE

1. Field of the Disclosure

The present invention relates to a fabricating apparatus and method of a flat plate display which can prevent spots generated on a non-uniform surface of a stage.

2. Discussion of the Related Art

Various kinds of flat plate displays capable of reducing a weight and volume which are disadvantages of a cathode ray tube (CRT) haven been emerging recently. Such a flat plate display includes a liquid crystal display (LCD), a field emission display, a plasma display panel and an electro-luminescence (EL) display.

This flat plate display is configured of a plurality of thin films formed by a mask process including depositing (coating), exposing, developing and etching. However, the mask process has complicated fabricating assembly process and it has a disadvantage of high production cost. As a result, research and study haven been under progress to form thin films via a patterning process using an imprinting mold in recent.

According to this patterning process, when a liquid polymeric precursor contacts with a mould for imprinting which has a groove and a projection after liquid resin is painted on a substrate, the groove and the projection of the imprinting mold are reverse-transferred to the liquid polymeric precursor and the reverse-transferred liquid polymeric precursor is hardened in a hardening process to form a desired thin film pattern on the substrate.

Here, a related art substrate having liquid resin coated thereon for a hardening process is seated on a stage 2 shown in FIG. 1.

A stage 2 having a stone surface is typically used for such the stage 2 because of excellent flatness without no distorted flatness. However, in spite of good flatness, the surface of the stage 2 has difference (D) between the lowest part and the highest part, for example, approximately 10~30 μm. This non-uniform flatness would generate spots in a thin film pattern and the non-uniform flatness of the stone surface stage 2 would be severe in case of an enlarged stage.

When the substrate 4 seated on the stage 2 having a non-uniform surface contacts with a imprinting mold 8, the pressure applied to a front surface of liquid resin 6 will generate pressure-non-uniform because of contact area between the stage 2 and the substrate 4. This kind of pressure non-uniform makes the thickness of the liquid resin 6 formed on the substrate 4 non-uniform which can look like spots.

SUMMARY OF THE DISCLOSURE

Accordingly, the present invention is directed to a fabricating apparatus and method of a flat plate display An object of the present invention is to provide a fabricating apparatus of a flat plate display which is able to spots generated on a non-uniform surface of a stage.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a fabricating apparatus of a flat plate display includes a stage on which a substrate having liquid resin formed thereon is seated; a imprinting mold bonded with the liquid resin of the substrate to form a thin film pattern on the substrate, the imprinting mold comprises projections and grooves; and a planarization layer formed between the stage and the substrate to planarize a surface of the stage.

The planarization layer may include a buffer layer formed of Poly Urethane.

The planarization layer may further include a slip layer formed between the buffer layer and the substrate.

The planarization layer may further include an adhesive layer formed between the buffer layer and the stage and between the buffer layer and the slip layer.

Shore hardness of the buffer layer may be 20~90 or less and coefficient of static friction of the slip layer may be 1 or less.

In another aspect of the present invention, a fabricating method of a flat plate display includes steps of: forming a planarization layer on a stage to planarize a surface of the stage; seating a substrate having liquid polymeric precursor formed thereon on the planarization layer; bonding an imprinting mold and the substrate with each other for the imprinting mold comprising grooves and projections to press the liquid polymeric precursor; and separating the substrate and the imprinting mold from each other.

The step of forming the planarization layer may form a buffer layer formed of Poly Urethane on the stage.

The step of forming the planarization layer may include a step of forming a slip layer between the buffer layer and the substrate.

The step of forming the planarization layer may further include a step of forming an adhesive layer between the buffer layer and the stage and between the buffer layer and the slip layer.

The present invention may have following advantages.

According to the fabricating apparatus and method of the flat plate display, the non-uniform surface of the stage may be planarized by using the planarization layer. As a result, spots of the thin film pattern generated by the thickness difference of the stage may be prevented.

Furthermore, according to the fabricating apparatus and method of the flat plate display, the top layer of the planarization layer may be the slip layer. As a result, the motion of the substrate may be efficient when the substrate and the stage are aligned to each other.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incor- In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1:
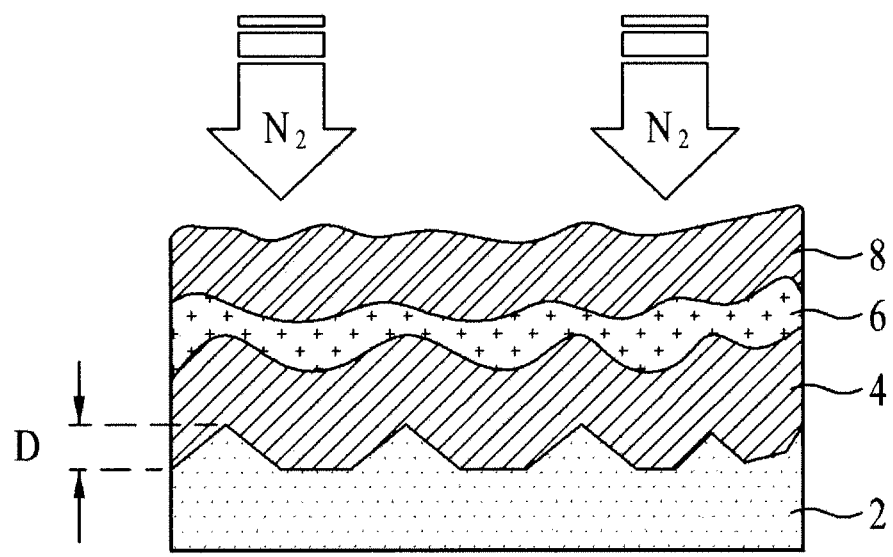
FIG. 1 is a sectional view illustrating a related art stage.
Figure 2:
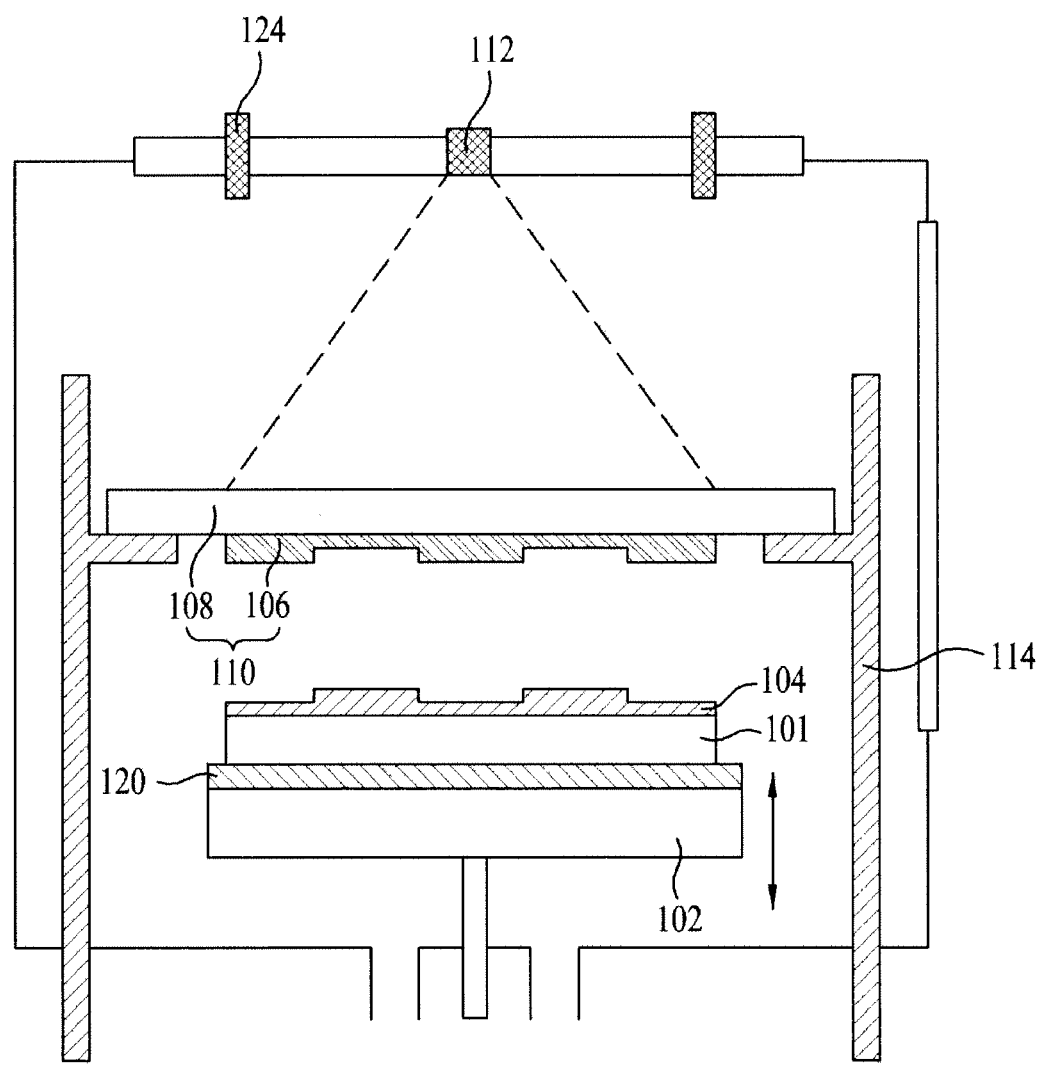
FIG. 2 is a sectional view illustrating a fabricating apparatus of a flat plate display according to the present invention.

FIG. 2 is a sectional view illustrating a fabricating apparatus of a flat plate display according to the present invention.

The fabricating apparatus for imprinting includes a substrate 101, a stage 102, a imprinting mold 110, a light source part 112, a vision part 124, a supporter 114 and a planarization layer 120.

The stage 102 is formed of a stone surface plate or Aluminum and the substrate 101 is seated on the stage 102.

On such the substrate 101 may be formed a thin film pattern 104 configured of liquid polymeric precursor patterned by pressing-contact with the imprinting mold 110. The thin film pattern 104 has a predetermined shape reverse-transferred from grooves and projections of the imprinting mold 110.

Figure 3:
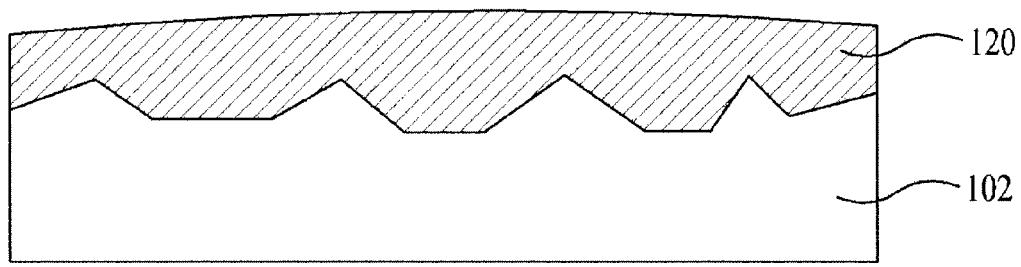
FIG. 3 is a plane view specifically illustrating a planarization layer shown in FIG. 2.

The imprinting mold 110 includes a back plane 108 and a mold part 106 formed on the back plane 108. The size of the back plane 108 may be formed larger than the size of the substrate 101 as shown in FIG. 3. The size of the mold part 106 may be formed similar to the size of the substrate and it includes grooves and projections to form the thin film pattern 104.

The light source part 112 emits lights such as ultraviolet rays or infrared rays to the imprinting mold 110 to harden the thin film pattern 104 formed on the substrate 101.

The vision part 124 identifies a location difference between the imprinting mold 110 and the substrate 101 and it compensate the difference.

Figure 4:
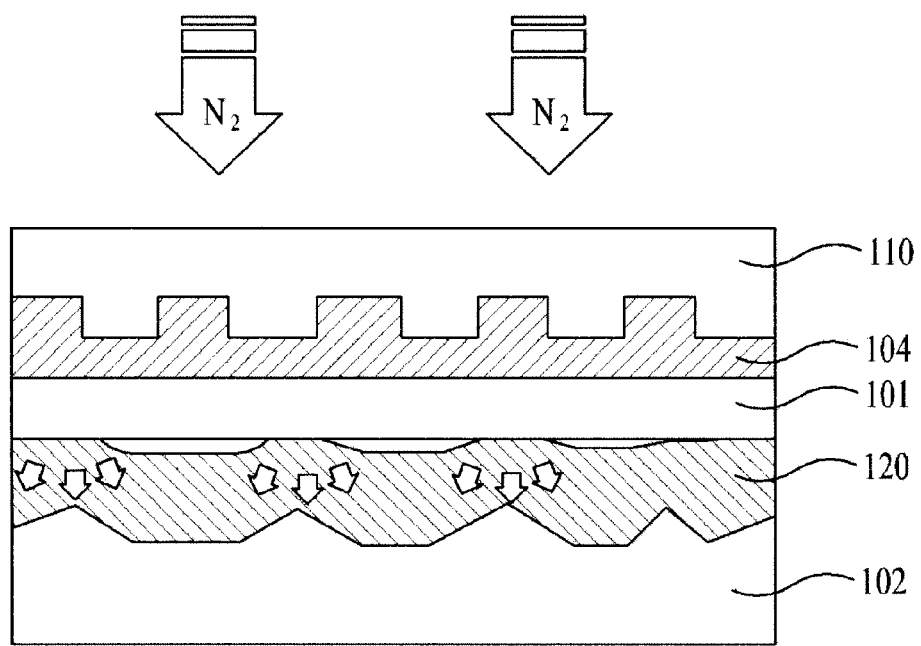
FIG. 4 is a diagram illustrating a process of dispersing the pressure by using the planarization layer shown in FIG. 2.

The mold-for-imprinting support part 120 includes a supporting frame 114, a supporter 116 and a horizontal compensating part 118 as shown in FIG. 4.

The supporter 114 is formed to allow an edge of a back surface of the back plane 108 of the imprinting mold 110 seated thereon. That is, the supporter 116 contacts with the edge of the back surface of the imprinting mold 110. As a result, the supporter 116 may not affect the moving passage of the ultraviolet rays or infrared rays when the liquid polymeric precursor is hardened by using the light source part 112.

The planarization layer 120 has a shore hardness of 20~90 which is lower than hardness of the substrate 101 and it is formed of a buffer layer having a single layer made of Urethane or Silicon Rubber. This planarization layer 120 is laminated on the stage 102 as film or it may be directly coated on the stage 102 or it may be attached to the stage 102 by adhesives.

As shown in FIG. 4, the planarization layer 120 disperses the pressure generated when N2 gas is supplied to a chamber during the bonding process of the imprinting mold 110 and the substrate 101, because it has elastic restitution. As a result, a rear surface of the planarization layer 120 in contact with the stage 102 has non-uniform stress distribution and this non-uniform stress distribution is corresponding to non-uniform stage of the surface of the stage 102. As coming toward a front surface of the planarization layer 120 in contact with the substrate 101, stress distribution is getting uniform. A front surface of the planarization layer 120 in contact with the substrate 101 has a planarized surface and the thickness difference of the stage 102 may be compensated accordingly.

According to the apparatus for imprinting according to this embodiment of the present invention, the non-uniform surface of the stage 102 is planarized by using the planarization layer 120. As a result, spots which might be generated by the thickness difference of the stage 102 may be prevented.

Figure 5:
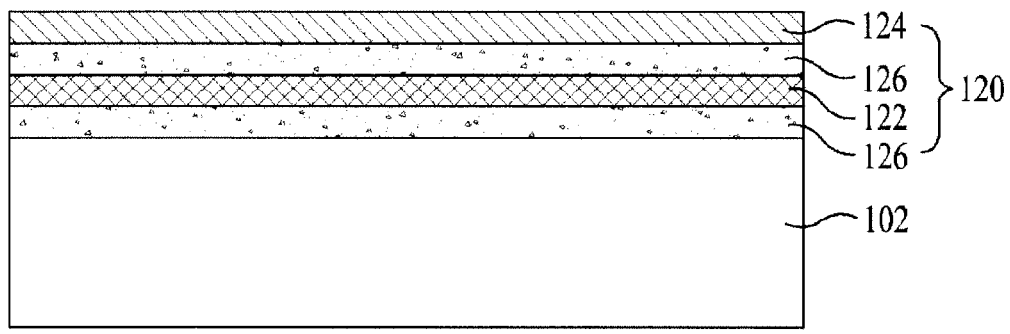
FIG. 5 is a diagram illustrating another embodiment of the planarization layer shown in FIG. 2.

FIG. 5 is a sectional view illustrating a planarization layer provided in a fabrication apparatus of a flat plate display according to another embodiment of the present invention.

The planarization layer 120 shown in FIG. 5 includes identical configuration components to the planarization layer shown in FIG. 3, except a slip layer 123 and an adhesive layer 126, and detailed description of the identical components will be omitted accordingly.

The slip layer 123 is a region in contact with the substrate 101 and it reduces friction with the substrate as much as possible to enable the substrate 101 to smoothly move in a centering process for moving the substrate 101 when stage 102 and the substrate 101 are aligned to each other. For that, a coefficient of static friction of the slip layer 124 is 1 or less. Such the slip layer 124 is formed of Polyethylene terephthalate (PET) or Polyethylene (PE).

The adhesive layer 126 is formed between the buffer layer 122 and the stage 102 to adhere them to each other and it is formed between the buffer layer 122 and the slip layer 124 to adhere them to each other. Such the adhesive layer 126 is formed of Acryl based material.

The buffer layer 122 has shore hardness of 20~90 and it is formed of Urethane material. As shown in FIG. 4, the buffer layer 122 disperses the pressure generated when N2 gas is supplied to the chamber during the bonding process of the imprinting mold 110 and the substrate 101 because it has elastic restitution. As a result, a rear surface of the buffer layer 122 in contact with the stage 102 has non-uniform stress distribution, corresponding to the surface of the stage 102. However, as coming toward a front surface of the buffer layer 122 in contact with the substrate 101, the stress distribution is getting uniform. As a result, a front surface of the buffer layer 122 in contact with the substrate 101 has a planarized surface and the thickness difference of the stage 102 may be compensated accordingly.

Figure 6A:
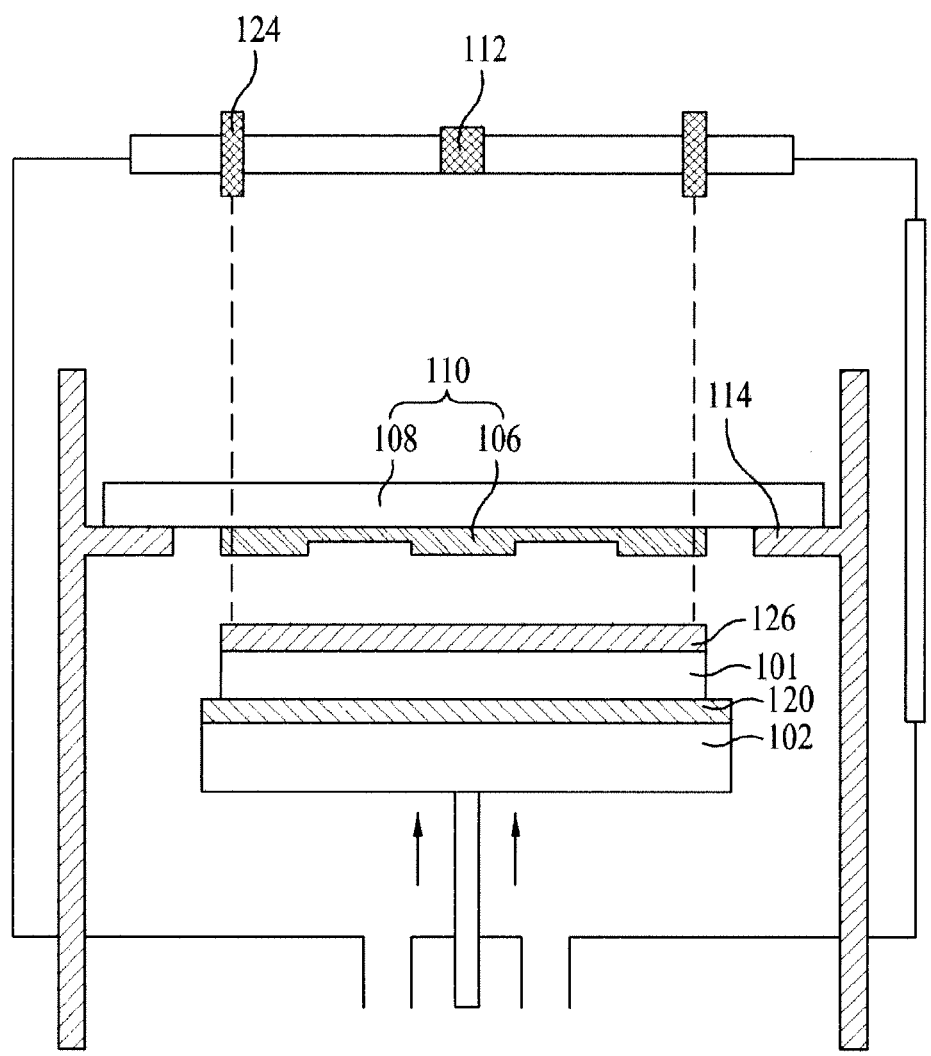
FIGS. 6A to 6C are sectional views illustrating a fabricating method of a flat plate display using the fabricating apparatus shown in FIG. 2.
Figure 6B:
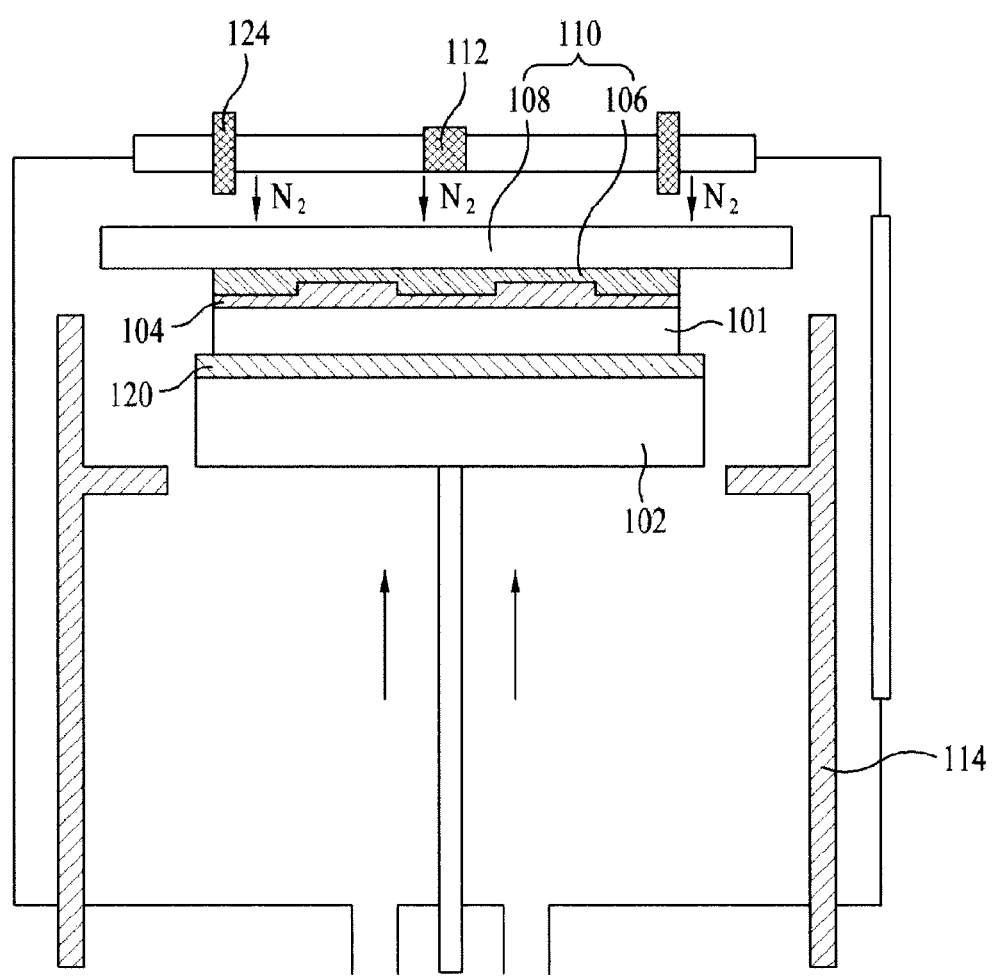
Figure 6C:
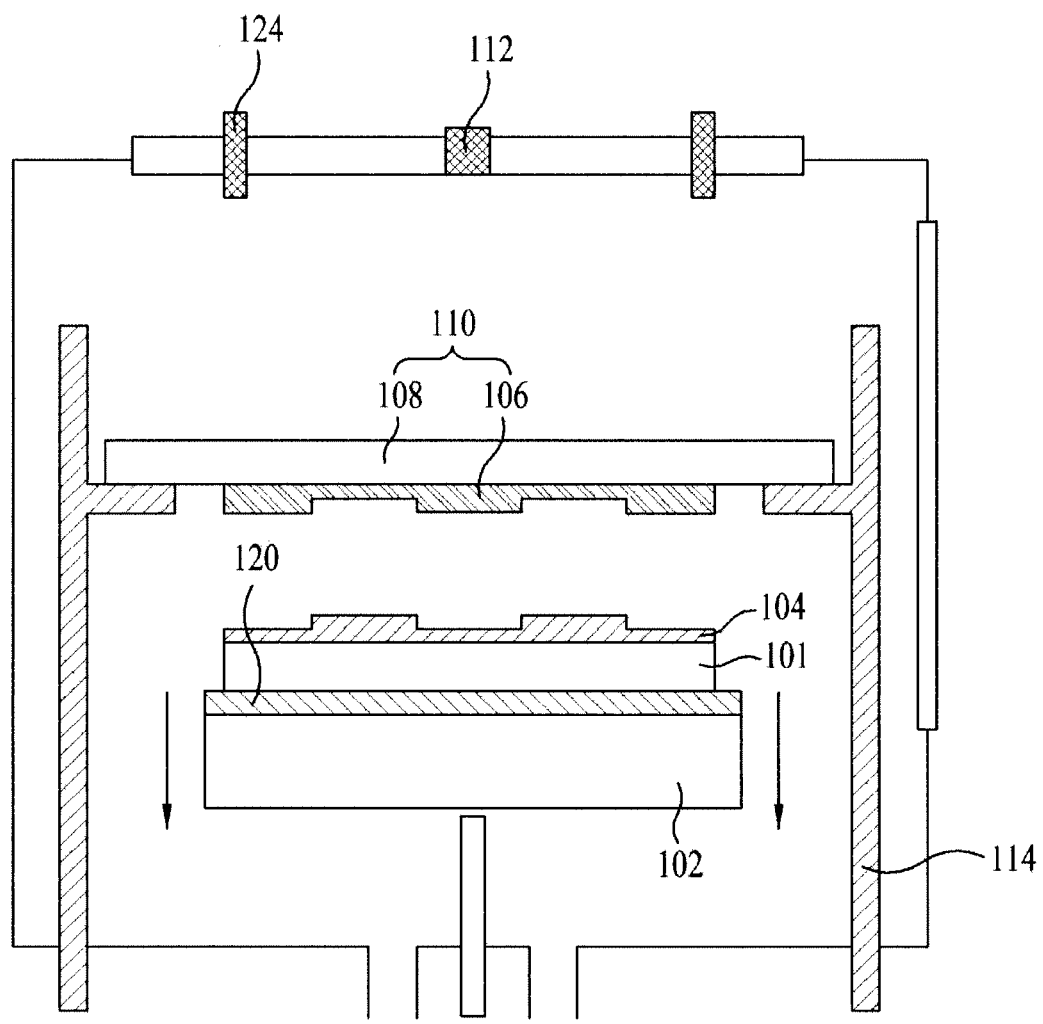

FIGS. 6A to 6C are sectional views illustrating a fabricating method of a flat plate display which uses the fabricating apparatus shown in FIG. 2.

First of all, the liquid polymeric precursor 126 is coated, for example, spin-coated, spinless-coated and the like on the substrate 101. The substrate 101 having the liquid polymeric precursor 126 is seated on the planarization layer 120 configured to planarize the surface of the stage 102 as shown in FIG. 6A. The stage 102 having the substrate 101 seated thereon moves upward by the maximum height not in contact with the imprinting mold 110. After that, the imprinting mold 110 and the substrate 101 are aligned to for align-keys (not shown) formed in both the imprinting mold 110 and the substrate 101 via the vision part 124 to correspond with each other.

The stage 102 having the substrate aligned to the imprinting mold thereon may move upward higher than the height of the supporter 114 as shown in FIG. 6B.

Here, when the stage 102 moves upward higher than the height of the supporter 114, the imprinting mold 110 is bonded with the substrate 101. At this time, N2 gas is injected into the chamber. After that, solvent in the liquid polymeric precursor is absorbed to a surface of the imprinting mold 110 to move the liquid polymeric precursor into the grooves of the imprinting mold 110 and the liquid polymeric precursor is hardened by the light source part 112 to form the thin pattern 104 on the substrate 101. The thin film pattern 104 has a shape reverse-transferred from the grooves of the imprinting mold 110.

Hence, as shown in FIG. 6C, the stage 102 on which the substrate 101 having the thin film pattern 104 formed therein is seated may move downward and the horizontal compensating part 118 may move downward toward the imprinting mold 110 simultaneously.

Figure 7:
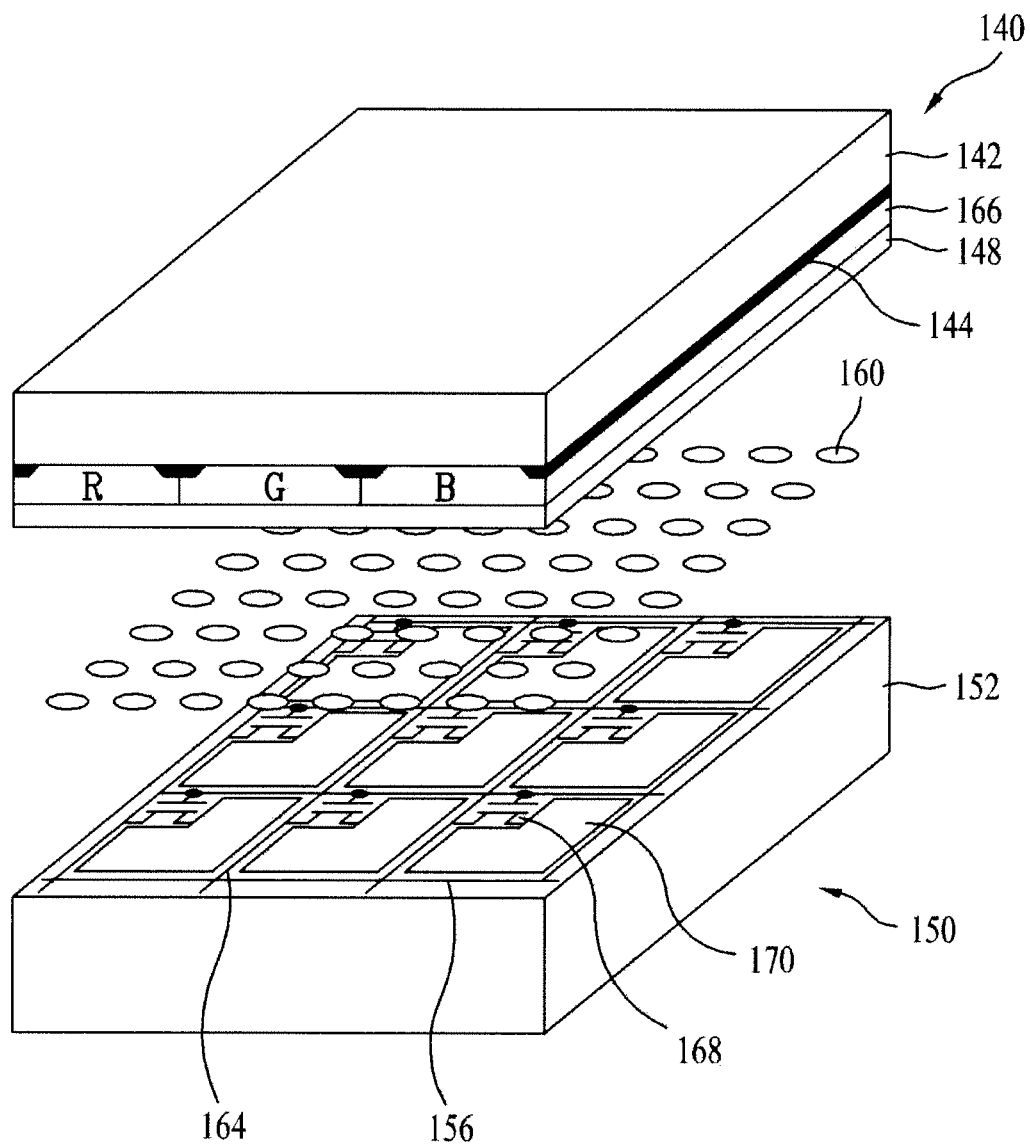
FIG. 7 is a perspective view illustrating a liquid crystal display panel having a thin film pattern formed by the fabricating method shown in FIGS. 6A to 6C.

The thin film pattern 104 formed by using the imprinting mold 110 is applicable to a liquid crystal display panel shown in FIG. 7. Specifically, the liquid crystal display panel according to the present invention shown in FIG. 7 includes a thin film transistor substrates 150 and a color filter substrate 140 which are bonded in opposite, with a liquid crystal layer 160 formed there between.

The color filter substrate 140 includes a black matrix 144 formed on a top substrate 142 to prevent light escape, a color filter 166 configured to represent colors, a common electrode 148 configured to form a pixel electrode and an electric field, a cover-coat layer configured for planarization, a column spacer formed on the over-coat layer to maintain a cell gap and a top alignment layer (not shown) configured to cover the other components.

The thin film transistor substrate 150 includes gate lines 156 and data lines 164 which are formed on a lower substrate 152 with crossing each other, thin film transistors 169 located adjacent to cross points of the gate and data lines, pixel electrodes 170 formed in pixel regions formed by the crossover structure, and a lower alignment layer (not shown) configured to cover the other components.

Such the color filter 166, black matrix 154, column spacer, thin film transistors 168, gate lines 156 and data lines 164 and pixel electrode 170 may be formed by the patterning process using the above imprinting mold including the grooves corresponding to patterns thereof.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A fabricating method of a flat plate display comprising steps of:
    forming a planarization layer on a stage to planarize a surface of the stage;
    seating a substrate having liquid polymeric precursor formed thereon on the planarization layer;
    bonding an imprinting mold and the substrate with each other, the imprinting mold comprising grooves and projections to press the liquid polymeric precursor to form a thin film pattern having a shape transferred from the imprinting mold; and
    separating the substrate and the imprinting mold from each other,
    wherein a rear surface of the planarization layer has non-uniform stress distribution corresponding to a non-uniform surface of the stage, and a front surface of the planarization layer has a planarized surface; and
    wherein forming the planarization layer comprises:
        forming a buffer layer of a single layer of polyurethane on the stage to disperse pressure generated during the bonding step and compensate for non-uniform stress distribution and thickness differences in the stage;
        forming a slip layer on top of the buffer layer and directly contacting the substrate to reduce friction between the substrate and the stage, wherein the buffer layer is formed on a level closer to the stage than the slip layer; and
        forming an adhesive layer between the buffer layer and the stage and between the buffer layer and the slip layer, wherein the adhesive layer is an acryl based material.

2. The fabricating method of claim 1, wherein coefficient of static friction of the slip layer is 1 or less.

* * * * *